(12) United States Patent
Patwardhan et al.

(10) Patent No.: US 7,629,246 B2
(45) Date of Patent: Dec. 8, 2009

(54) HIGH STRENGTH SOLDER JOINT FORMATION METHOD FOR WAFER LEVEL PACKAGES AND FLIP APPLICATIONS

(75) Inventors: Viraj Patwardhan, Milpitas, CA (US); Hau Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 298 days.

(21) Appl. No.: 11/897,971

(22) Filed: Aug. 30, 2007

(65) Prior Publication Data

US 2009/0057897 A1 Mar. 5, 2009

(51) Int. Cl.
*H01L 21/44* (2006.01)
(52) U.S. Cl. ............... 438/613; 438/615; 257/E21.508
(58) Field of Classification Search .......... 438/613, 438/614, 615; 257/E21.508
See application file for complete search history.

(56) References Cited

U.S. PATENT DOCUMENTS

2002/0171143 A1* 11/2002 Kinsman ............... 257/737
2004/0177997 A1* 9/2004 Hata et al. ............. 174/257
2008/0169539 A1* 7/2008 Fang et al. ............. 257/676

FOREIGN PATENT DOCUMENTS

JP 2000228455 A * 8/2000

OTHER PUBLICATIONS

Pang, et al., *Intermetallic Growth Studies on Sn-Ag-Cu Lead-Free Solder Joints*, Journal of Electronic Materials, vol. 33, No. 10, 2004.

* cited by examiner

*Primary Examiner*—Trung Dang
(74) *Attorney, Agent, or Firm*—Beyer Law Group LLP

(57) ABSTRACT

A Micro SMDxt package is provided that configured for mounting to a circuit board. The SMDxt package includes a silicon-based IC having an array of contact pads on one side of thereof, and a die electrically attached to the silicon-based IC. A plurality of solder balls is included, each of which has a polymeric core surrounded by a metallic shell that in turn is surrounded by a layer of solder material. Further, each solder ball is positioned in contact with a corresponding contact pad of the package. An intertwined intermetallic fusion layer is formed through the fusion between material components of the contact pads and the solder material, via heat treatment. The intermetallic fusion extends between and from an outer surface of the metallic shell of each solder to an outer surface of a corresponding contact pad to form a high strength intermetallic solder joint therebetween.

16 Claims, 10 Drawing Sheets

| Leg ID | Device (NoPb) | Si Thk | No of reflows @ unit level | No. of Reflows on PCB | Total Reflows | 500 cyc | 750 cyc | 1000 cyc | 1350 cyc | 1922 cyc | 2550 cyc | 2891 cyc |
|---|---|---|---|---|---|---|---|---|---|---|---|---|
| 1 | BP100RL | 12 mil | N/A | 1 | 1 | 0/32 | 0/32 | 0/32 | 8/32 | 28/32 | @ FA | N/A |
| 2 | BP100RL | 12 mil | N/A | 3 | 3 | 0/32 | 0/32 | 3/32 | 13/32 | 30/32 | @ FA | N/A |
| 3 | BP100RL | 12 mil | N/A | 5 | 5 | 0/32 | 0/32 | 0/32 | 3/32 | 12/32 | 15/32 | 17/32 |
| 4 | BP100RL | 12 mil | N/A | 7 | 7 | 0/31 | 0/31 | 0/31 | 5/31 | 11/31 | 20/31 | 23/31 |
| 5 | BP100RL | 12 mil | N/A | 10 | 10 | 0/32 | 0/32 | 0/32 | 1/32 | 1/32 | 4/32 | 8/32 |
| 6 | BP100RL | 12 mil | 1 | 1 | 2 | 0/31 | 0/31 | 0/31 | 1/31 | 3/31 | 7/31 | 9/31 |
| 7 | BP100RL | 12 mil | 3 | 1 | 4 | 0/30 | 0/30 | 0/30 | 0/30 | 0/30 | 0/30 | 0/30 |
| 8 | BP100RL | 12 mil | 5 | 1 | 6 | 0/32 | 0/32 | 0/32 | 0/32 | 2/32 | 2/32 | 3/32 |
| 9 | BP100RL | 12 mil | 7 | 1 | 8 | 0/32 | 0/32 | 0/32 | 1/32 | 2/32 | 3/32 | 3/32 |
| 10 | BP100RL | 12 mil | 9 | 1 | 10 | 0/32 | 0/32 | 0/32 | 1/32 | 1/32 | 3/32 | 4/32 |

FIG. 9

HIGH STRENGTH SOLDER JOINT FORMATION METHOD FOR WAFER LEVEL PACKAGES AND FLIP APPLICATIONS

BACKGROUND

The present invention relates generally to the wafer level packaging, and more particularly relates to the formation of high strength solder joints thereon.

There are a number of conventional arrangements for packaging integrated circuits. Many packaging techniques use a leadframe that has been stamped or etched from a metal (typically copper) sheet to provide electrical interconnects to external devices. One relatively recently developed packaging style, which is sometimes referred to as a Micro SMD (Surface Mount Devices) package, as shown in FIG. 1, which is wafer level CSP. In a micro SMD package, the footprint of the package is generally equal to that of the die size, yielding a relatively dense array outline of contacts on the active side of the silicon IC. In fact, these packages have one of the smallest footprints per I/O count.

Typical micro SMD packages contain bump counts ranging from a four (4) (2×2 array outline) bump count to a thirty (30) bump count (5×6 array outline). At these smaller bump counts, the active side of the array are mounted to a Printed Circuit Board (PCB) in a manner similar to a typical Ball Grid Array (BGA) mount, via conventional solder joints. These packages, given their dense array of I/O contacts, are limited to about thirty (30) bumps due to the solder joint fatigue life. In general, the outer I/O contacts of a package, when mounted to a circuit board, are subjected to greater loading stress than those contacts that are central to the package due to greater DNP (Distance from Neutral Point). Such joint stress, for instance, may be experienced during thermo-cycling and/or during a drop testing. Due in part to the geometry and position of these outermost contact posts relative to those contacts centrally located, any central loads are magnified significantly at the perimeter of the package. Accordingly, contact failure at such outermost contact interfaces is more prevalent.

More recently, Micro SMDxt packages have been developed that have significantly larger bump counts than the array of contacts for a standard SMD package (typically up to a 5×6 array, or 30 bump count). These Micro SMDxt packages 25, as shown in FIG. 1, generally range from thirty-six (36) bumps (a 6×6 array outline) to 100 bumps (a 10×10 outline).

To enable solder mounting of these larger array Micro SMDxt packages, each solder joint incorporates a solder ball consisting of a polymeric core with a copper shell followed by an outer solder layer. Applying a single industry standard reflow process, a significantly higher strength joint can be created due to the flexibility of the polymeric core. Hence, a significantly longer fatigue life can be achieved than a conventional solder joint. Typical of such polymeric core solder balls are those commercially available by Sekisui Corporation of Japan.

However, proliferation of this package family beyond 100 bumps (10×10 array outline) is limited by the solder joint fatigue life. While the polymeric core allows a longer fatigue life than convention solder joints, it still reaches its limit in terms of fatigue life and life under drop/impact conditions. For example, FIG. 2 illustrates a magnified cross-section of a conventional solder ball joint 20 of reflowed solder 21 between a polymeric core solder ball 22 and a contact pad 23 for a micro SMDxt package 25. However, due to isothermal aging exposure, thermal cycling and thermal shock, the solder in these solder joints 20 is more adept to failed (fracture 26) in between the solder ball 22 and the contact pad 23 for larger bump packages Accordingly, it would be beneficial to provide a high strength solder joint capable of securing a high bump micro SMDxt to a circuit board. Given their many advantages, Micro SMDxt packages in general have recently generated a great deal of interest within the semiconductor industry. Although existing techniques for fabricating, packaging and mounting these Micro SMDxt work well, there are continuing efforts to develop even more efficient designs and mounting techniques.

SUMMARY OF THE INVENTION

To achieve the foregoing and other objects of the invention, improved arrangements and processes for packaging and mounting Micro SMDxt chips are described. In one specific embodiment a Micro SMDxt package is provided that configured for mounting to a circuit board. The SMDxt package includes a silicon-based IC having an array of contact pads on one side of thereof, and a die electrically attached to the silicon-based IC. A plurality of solder balls is included, each having a polymeric core surrounded by a metallic shell that in turn is surrounded by a layer of solder material. Each solder ball is further positioned in contact with a corresponding contact pad of the package. The present invention further includes an intertwined intermetallic fusion layer formed through the fusion between material components of the contact pads and the solder material, via heat treatment. The intermetallic fusion extends between and from an outer surface of the metallic shell of each solder to an outer surface of a corresponding contact pad to form a high strength intermetallic solder joint therebetween.

This intermetallic fusion layer, $Cu_6Sn_5$ in one embodiment, is very tough, and significantly more crack resistant than the standard polymeric cored solder ball joint. As a result, the fusion of this layer between the contact pad and the metallic shell of the solder ball have yielded a more durable high strength joint during adverse isothermal aging exposure, thermal cycling and thermal shock during the drop conditions In another aspect of the present invention, a method for forming a high-strength solder joint is provided between a solder ball and a microelectronic circuit package that contains at least one contact pad at its interconnect face. The method includes providing at least one polymeric solder ball that contains a polymeric core surrounded by a metallic shell, containing copper (Cu), and an outer layer of solder material, containing tin (Sn). The method further includes positioning the at least one solder ball atop the at least one contact pad of the circuit package. The contact pad also contains copper (Cu). In accordance with the present invention, the method includes reflowing the solder material between the solder ball and the corresponding contact pad for a preselected temperature range and a preselected time range. These selected heat treatment parameters cause an intermetallic layer, composed of $Cu_6Sn_5$ and formed on an outer surface of the contact pad, and an opposed intermetallic layer, composed of $Cu_6Sn_5$ and formed on an outer surface of the metallic shell of the solder ball, to coalesce and intertwine with one another to form a substantially unitary intermetallic joint therebetween.

In one specific configuration, the preselected peak temperature for the reflow is in the range of about 240° C. to about 255° C., and the preselected liquid time is in the range of about 40 seconds to about 90 seconds.

In another specific embodiment, the reflowing the solder material is accomplished by independently performing at least two (2) "industry standard reflow" process cycles on the solder ball/microelectronic circuit package. In yet another embodiment, the reflowing the solder material is accomplished by independently performing at least two (2), but no more than nine (9), "industry standard reflow" process cycles on the solder ball/microelectronic circuit package.

Another aspect of the present invention provides a method for mounting a microelectronic circuit package that contains a plurality of metallic contact pads at it interconnect face to a circuit board that contains metallic contacts corresponding in their layout to that metallic contact pads of the circuit package. The method includes providing a plurality of solder balls, each the solder ball having a polymeric core surrounded by a metallic shell that in turn is surrounded by a layer of solder material, and positioning each of solder balls atop a corresponding contact pad of the circuit package. Further, the method includes independently applying at least two (2), but no more than nine (9), "industry standard reflow" process cycles on the solder balls/microelectronic circuit package to reflow the solder material between each solder ball and the corresponding contact pad. Consequently, a respective intermetallic layer, formed on an outer surface of the contact pad, and a respective opposed intermetallic layer, formed on an outer surface of the metallic shell of the solder ball, coalesce and intertwine with one another to form a respective substantially unitary intermetallic joint therebetween. The method further includes positioning the circuit package, together with the reflowed solder balls, in alignment and mounting contact with the corresponding metallic contacts of the circuit board; and electrically connecting the contact pads of the circuit package to the corresponding contact pads of the circuit board.

In one embodiment, the electrically connecting includes applying one of the "industry standard reflow" process cycles to the circuit package/solder ball/circuit board combination. Further, the independently performing an "industry standard reflow" process is performed a total of 4 reflow cycles.

BRIEF DESCRIPTION OF THE DRAWINGS

The invention, together with further objects and advantages thereof, may best be understood by reference to the following description taken in conjunction with the accompanying drawings in which:

FIG. 2 is an enlarged side elevation view, in cross section, of a conventional polymeric solder ball joint between a micro SMDxt package and a PCB, and illustrating a stress fracture there through.

FIG. 9 is a table of test results comparing the contact failure of microelectronic packages incorporating varying degrees of the high-strength solder joints versus varying degrees of thermal cycling.

DETAILED DESCRIPTION OF PREFERRED EMBODIMENTS

Figure 1:
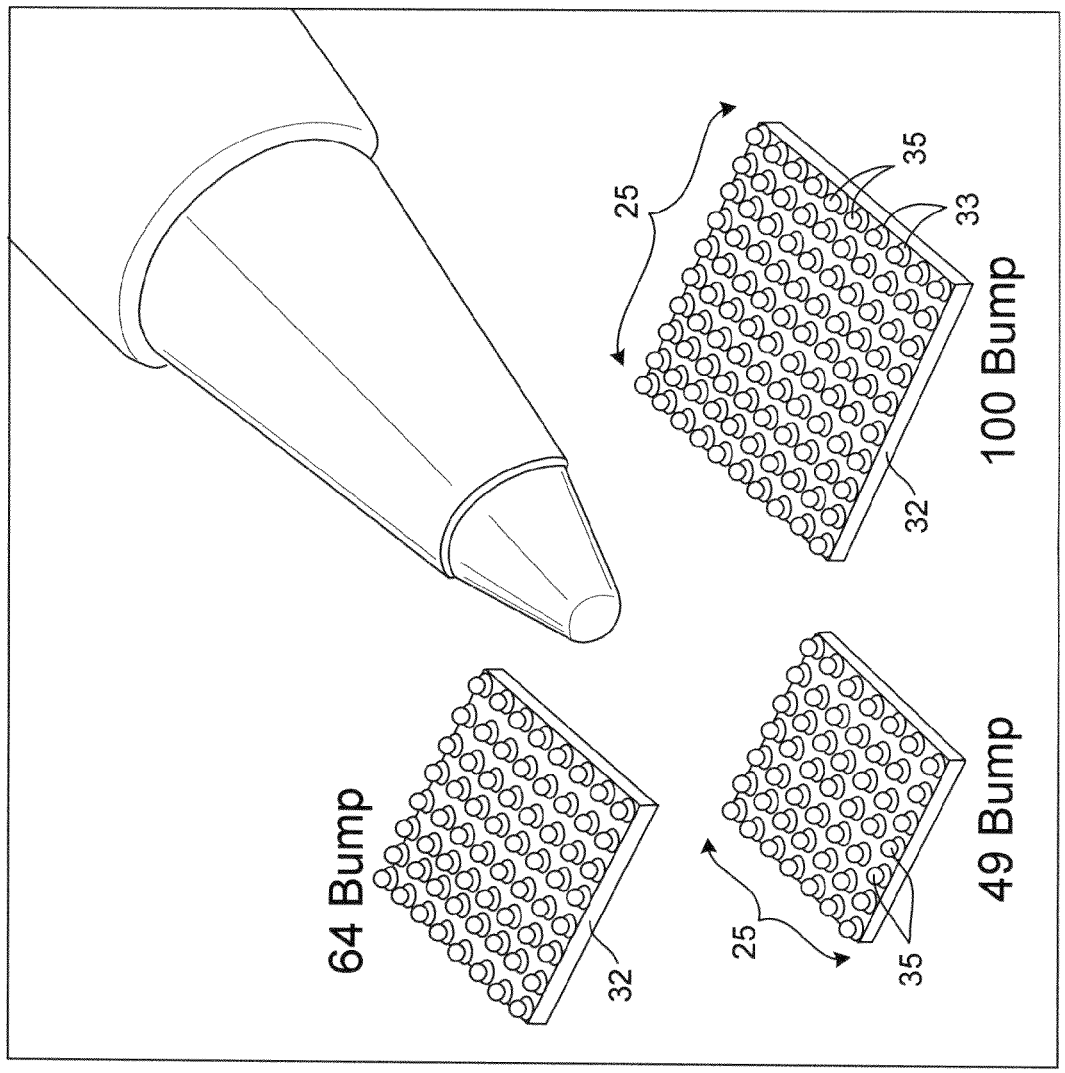
FIG. 1 is a perspective bottom side view of a few micro SMDxt packages with a plurality of polymeric solder balls supported thereon, and compared in size to an end of a ballpoint pen.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Referring now to the representative microelectronic package 25 of FIG. 1 and FIGS. 3-6, a high-strength solder joint, generally designated 30, is provided that is suitable for wafer level packages 25 and flip chip applications. More specifically, the present invention is particularly well suited for application with micro SMDxt package families beyond 100 bumps (e.g., 10×10 array outlines) that apply polymeric solder ball technology to mount and connect a circuit package to a circuit board.

Figure 5:
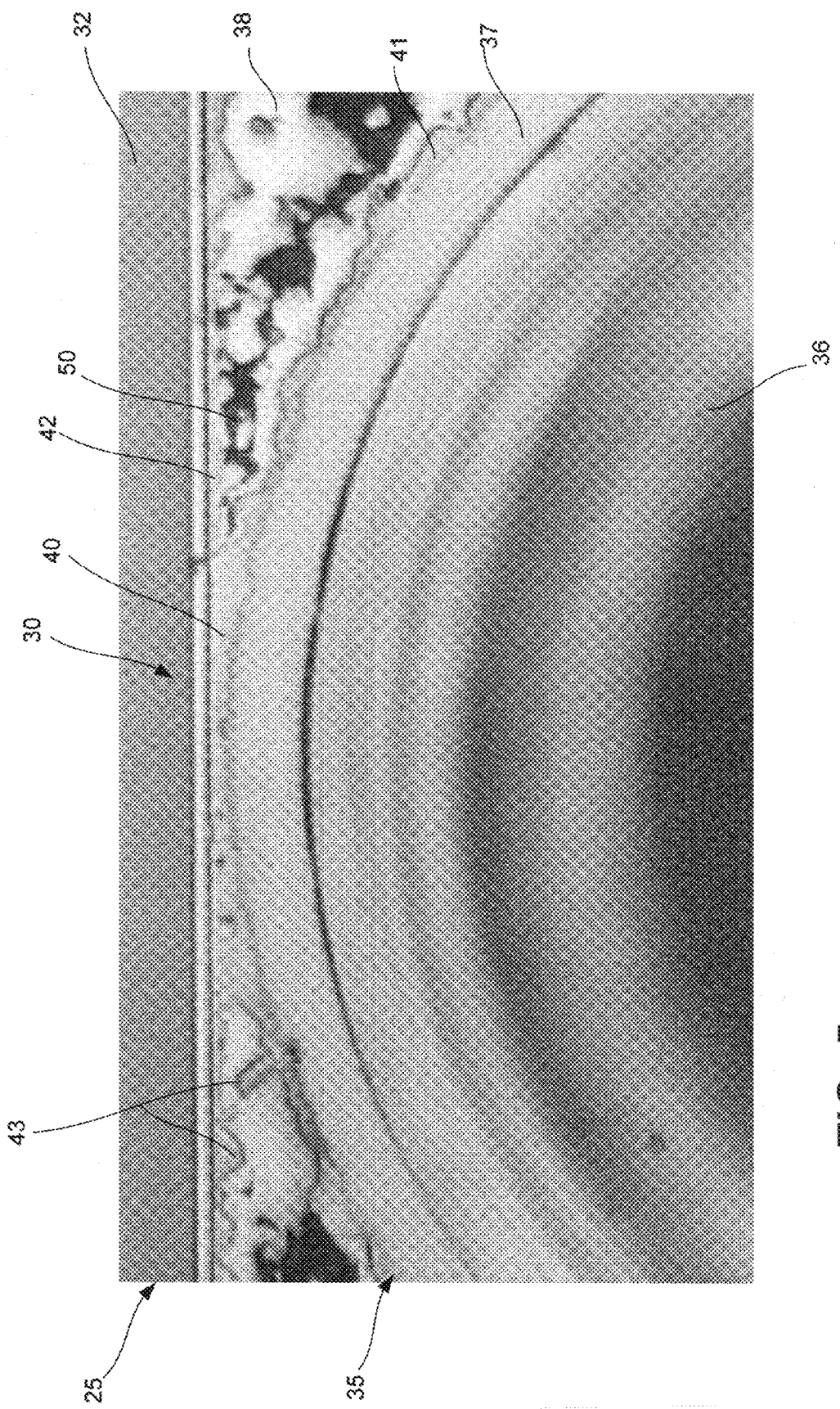
FIG. 5 is an enlarged side elevation view, in cross section, of another intermetallic fusion layer of the high-strength solder joint between a micro SMDxt package and a polymeric solder ball, in accordance with the present invention.
Figure 6:
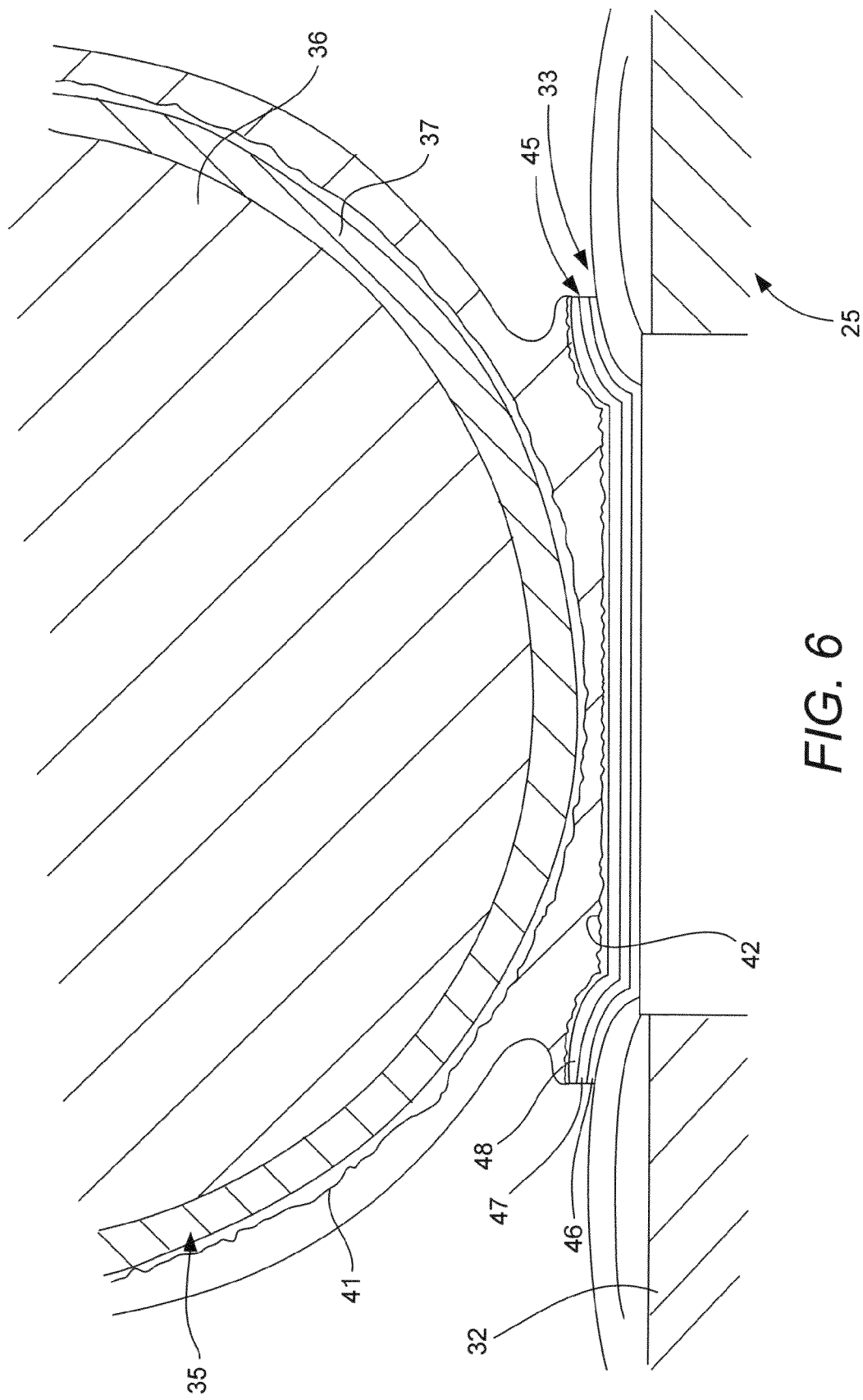
FIG. 6 is a diagrammatic, enlarged, side view of a high-strength solder joint, in accordance with the present invention, mounted to a UBM layer of the micro SMDxt package.

For instance, a SMDxt package, generally designated 25, is provided that includes a silicon-based IC 32 with a die (not shown) on one side, and an opposite active side having an array of contact pads 33. A plurality of solder balls 35 are provided, each of which is positioned adjacent and in electrical contact with a corresponding contact pad 33 of the package 25. Each solder ball is comprised of a polymeric core 36 surrounded by a metallic shell 37 (FIG. 6). These polymeric solder balls 35 further include a layer of solder material 38 adapted to be reflowed for electrical contact and mounting thereof, such as those commercially available by Sekisui Corporation of Japan. In accordance with the present invention, an intertwined and meshed intermetallic fusion layer 40 is formed between, and extending from, an outer surface of the metallic shell 37 of each solder ball to an opposed outer surface of a corresponding contact pad 33 (FIGS. 4 and 5) to form a substantially unitary high strength solder joint 30 in the space therebetween.

Figure 4:
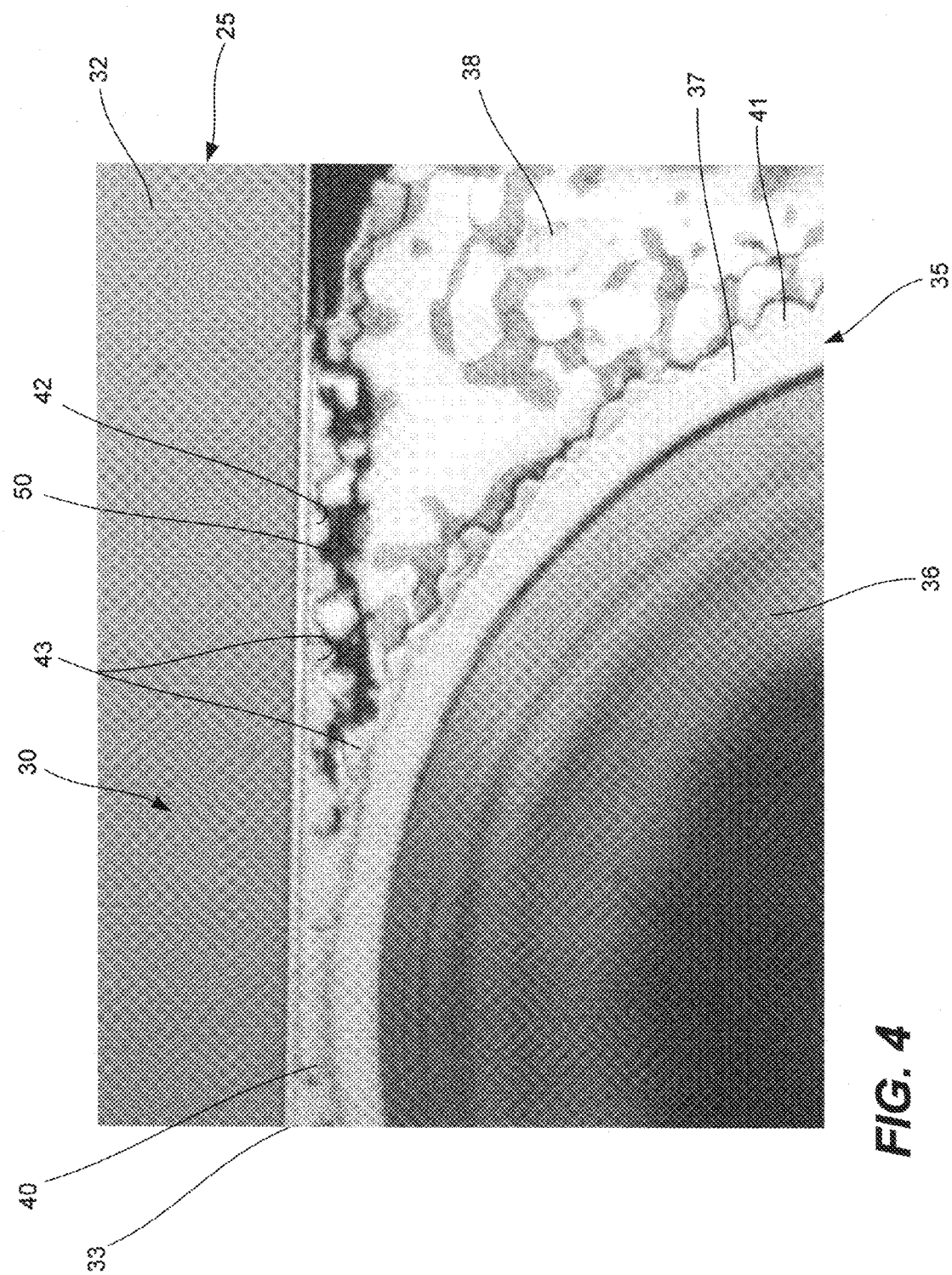
FIG. 4 is an enlarged side elevation view, in cross section, of the polymeric solder ball joint of FIG. 3, illustrating the formation of the intermetallic fusion layer between the solder ball metallic shell and the contact pad of the SMDxt package.

Applying heat treatment to the solder balls/microelectronic package, during the initial mount and electrical connection of the solder balls 35 to the corresponding contact pads 33 of the package, for a predetermined temperature and for a predetermined time, preferably in the form of multiple "industry standard reflow" process cycles (to be described below), the opposed intermetallic layers 41, 42 are caused to continue to grow toward one another from the opposed contacts (i.e., the metallic shell 37 and the contact pad 33) of the solder joint 30. That is, as shown in FIGS. 4 and 5, the intermetallic layer 41 of the outer surface of the metallic shell 37 is grown radially outward, via the heat treatment, and similarly the opposed intermetallic layer 42 from the outer surface of the contact pad 33 are grown toward one another until they coalesce and intertwine with one another to form the respective substantially unitary intermetallic fusion layer 40 of the joint 30. Unlike the current reflow standards to mount and electrically interconnect these polymeric solder balls to the underlying contacts (the reasons of which will be described below), the continued growth of each intermetallic layer 41, 42 is desired until the opposing protrusions or finger-like structures 43 (on a microscopic level) thereof intertwine and mesh with one another. Accordingly, the intertwined intermetallic fusion layer 40 substantially spans the gap of the solder joint between the outer surfaces of metallic shell to the outer surface of the contact pad 33 (FIGS. 4 and 5).

Generally, the composition of the intermetallic layer is significantly harder than that of the underlying bulk solder material. The continued formation of the intermetallic layers 41, 42, thus, have conventionally been considered to be detrimental in that the mechanical testing (i.e., the drop and/or flex) performance of these joints is lower due to the greater brittleness of the joint. Moreover, thicker the intermetallic layer between the span of the mounted solder ball 35 and the opposed contact pad, the less the amount of reflows solder material therebetween. Still further, the continued intermetallic layer formation often results in void "nucleation", which can eventually cause openings.

What was not considered, however, and in accordance with the present invention, was the continued growth of these opposed intermetallic layers 41, 42 until they fused and coalesced into substantially unitary intermetallic fusion layer 40.

The formation of the intermetallic fusion layer 40 is essentially caused by the fusion (via the heat treatment) of one or more of the material components of the metallic shell 37 of the solder ball 35 and that from the outer layer of corresponding contact pad 33. Depending upon the compositions of the solder ball metallic shell 37, the contact pads 33 and that of the solder, thus, the composition of the intermetallic layer may be determined. Moreover, composition and growth rate of the intermetallic layer is also function of: the amount (percentage) of one of the fused components in the contact pad, the metallic shell and the solder material; the temperature of the solder reflow; and the amount of time spent at the temperature above the reflow temperature (about 218° C.) of the solder material (which could also be affected by the number of solder reflows).

In the preferred embodiment, for example, the contact pads 33 and the metallic shells 37 of the polymeric solder balls 35 are conventionally comprised of a larger percentage of copper (Cu). In fact, for micro SMDxt applications, the contact pad 33 often includes an Under Ball Metallurgy (UBM) layer 45 to seat and align the solder balls for mounting thereof. The UBM layer 45, as shown in FIG. 6, typically includes an underlying Titanium-Aluminum (TiAl) alloy layer 46, followed by a Nickel-Vallidium (NiV) alloy layer 47, which in turn contains an outer copper layer 48. Applying a tin based solder (i.e., the composition of the solder layer 38 of the solder ball 35), which is standard in the electronic industry, together with the copper based (or at least plated) contacts, the resulting intermetallic layer 41, 42, formed via the heat treatment process, is an alloy composed of Copper-Tin ($Cu_6Sn_5$).

Although Tin-lead based (SnPb) solders were once considered the industry standard, recent changes in the electronics industry in the U.S. and abroad now favor the application lead (Pb) free solders. Typical of these Tin based solders that are lead-free is a Tin-Silver ($Ag_3Sn$) solder alloy, which is composed primarily of tin. For instance, one common Tin-Silver based solder is 96.5% tin and 3.5% silver. Other percentage Tin-Silver solder alloys may be applied, as well other tin based compositions that are lead-free.

Figure 2:
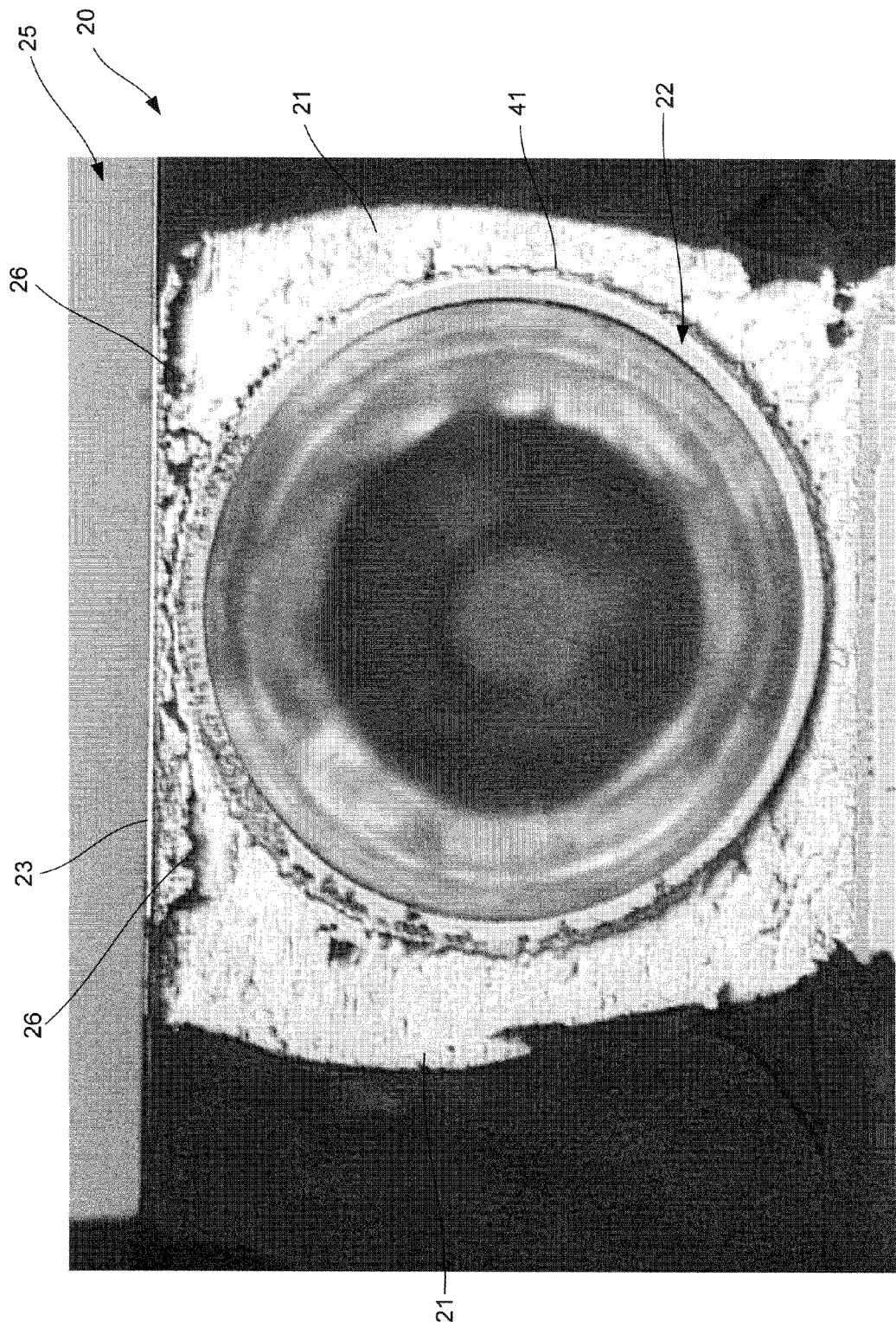
Figure 3:
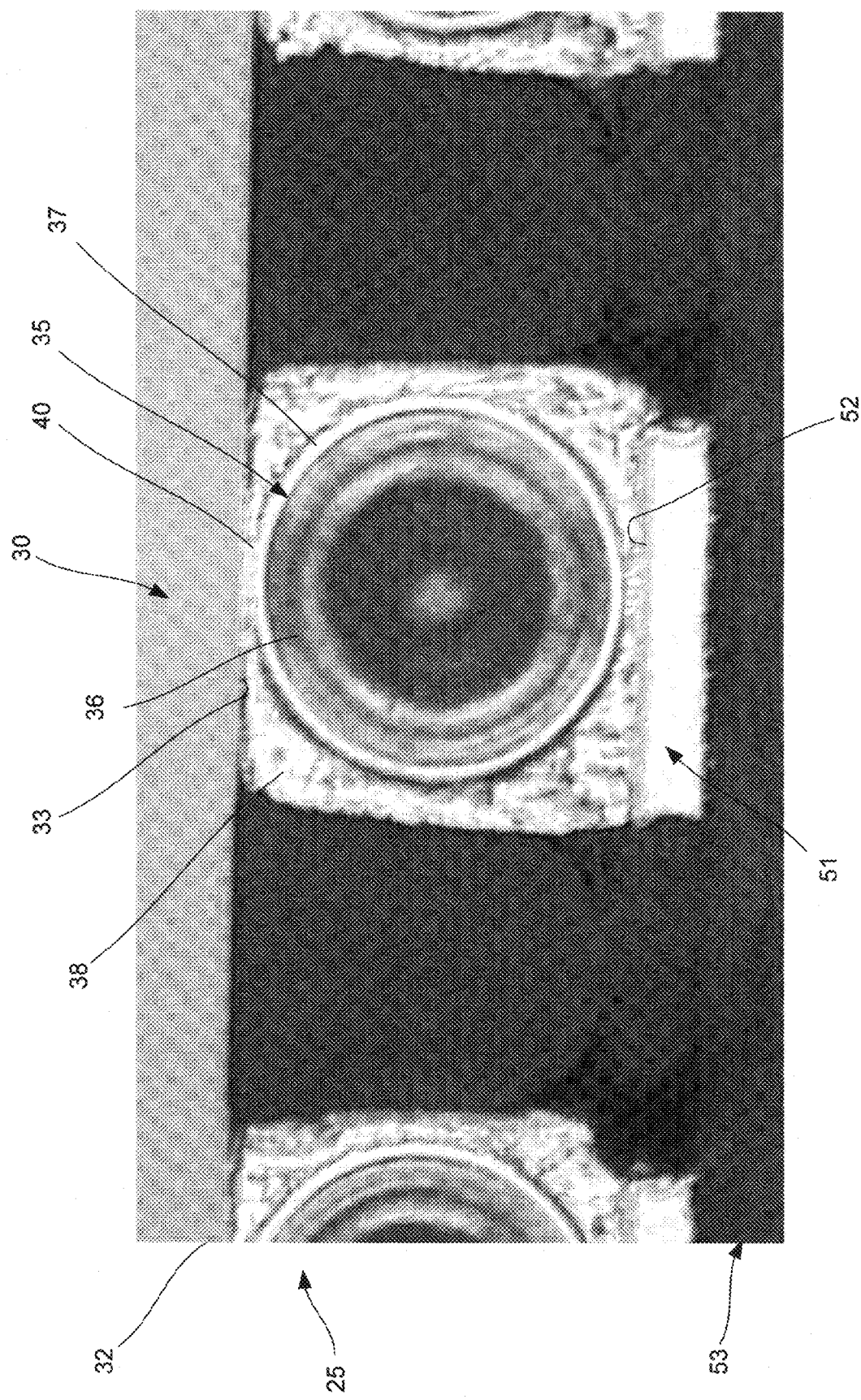
FIG. 3 is an enlarged side elevation view, in cross section, of a polymeric solder ball joint between a micro SMDxt package and a PCB, in accordance with the present invention.

As mentioned, the resulting intermetallic layer material (e.g., $Cu_6Sn_5$) is very tough, and significantly more crack resistant than the standard polymeric cored solder ball joint 20 (FIG. 2) which contains a thin pair of opposed intermetallic layers 41, 42 sandwiched around the layer of reflowed solder 38 therebetween. As shown in the standard solder ball joint 20 of FIG. 2, under adverse isothermal aging exposure, thermal cycling and thermal shock during the drop conditions, a fatigue/stress crack 26 will ultimately migrate through the contact pad/reflow solder interface.

The solder ball joint 30 of the present invention, however, under substantially similar thermal and/or drop/impact type conditions yield a substantially more crack resistant solder joint due the fully developed, intertwined and coalesced intermetallic layers 41, 42 that now vertically span the gap between the contact pad 33 and the metallic shell 37 of the solder ball 35. As best viewed in FIGS. 4 and 5, while a stress/fatigue crack 50 has commenced through the reflowed solder 38, further migration of the crack through the interface was halted by the significantly harder and more durable intermetallic material.

By way of example, the intertwined and meshed $Cu_6Sn_5$ intermetallic joint 30 has been observed to withstand about four (4) times the thermal fatigue as compared to a standard polymeric cored solder ball, and about two (2) times the life expectancy in terms of drop/impact type performance. For portable applications utilizing an increasingly complex range of miniature packages, which are to be subject to ever harsher criteria for acceptable performance (e.g., the past criteria for miniature packages used to be 30-40 drops, now being replaced by 150 drops criteria by some customers), this high-strength solder joint 30 results in a significantly more favorable acceptance/rejected use ratio.

The formation of the intermetallic fusion layer 40 formation is essentially caused by the fusion (via the heat treatment) of one or more of the material components of the metallic shell 37 of the solder ball 35 and that from the outer layer of corresponding contact pad 33. Hence, the formation and growth of the intermetallic layer is a function of: the amount (percentage) of one of the fused components in the contact pad, the metallic shell and the solder material; the temperature of the reflow; and the time spent at the temperature above the reflow temperature of the solder material (which could also be affected by the number of reflows).

In accordance with the present invention, the heat treatment process is formulated in a manner that enables sufficient growth of the intermetallic layer 41, 42 from both the metallic shell side of the solder balls 35 and from the contact pad side of the package until the opposed finger-like structures 43 of the intermetallic layers coalesce and intertwine together with one another. In one embodiment, for instance, the coalesced intermetallic joint can be formed by baking at high temperature with a calculated time to permit such intertwined growth.

In another aspect of the present invention, the "units of measure" for the range heat treatment parameters that are applied to fabricate and coalesce the opposed intermetallic layer 41, 42 into the unitary intermetallic joint 30 are in the form of the number of "industry standard Lead-free reflow profile" process cycles for board level reflow solder commonly applied in the chip manufacture industry. Such a unit of measure is selected for the ease of implementation, since such standardized reflow processes and procedures are already firmly accepted in all aspects of semiconductor fabrication (i.e., methodology, equipment and standardization). Hence, any additional solder reflow process cycles that are performed on the package/solder balls for electrical mounting thereof are simple to implement without any significant fabrication or equipment changes. Moreover, this heat treatment process can be done entirely at the wafer level immediately after wafer bumping. Hence, the process is kept transparent to the customer/end-user.

Figure 7:
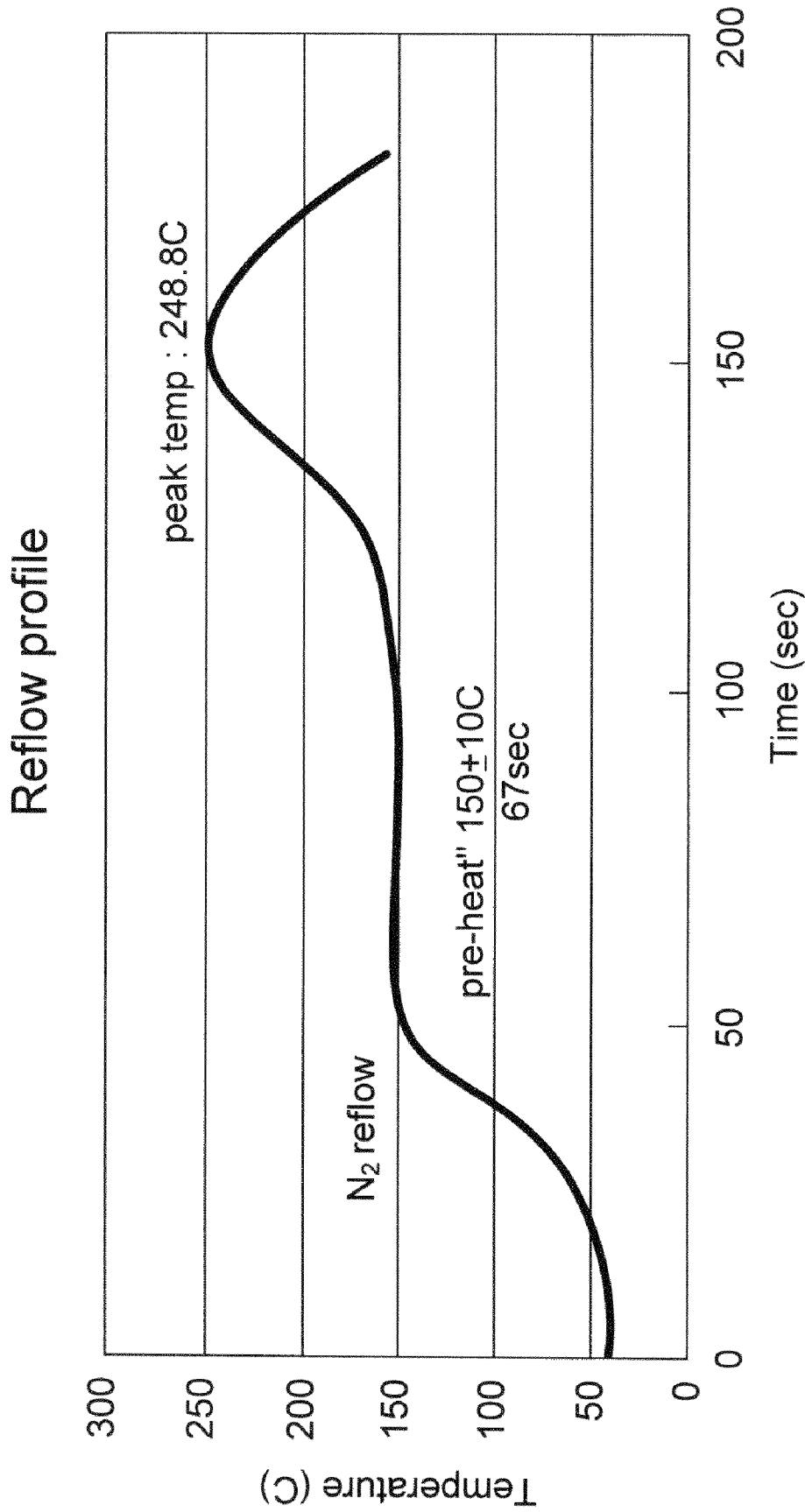
FIG. 7 is a diagram of an industry standard reflow profile for 96.5% Tin-Silver (SnAg) solder.

By way of example, the standard reflow profile for a selected solder composition of 96.5% SnAg, is shown in FIG. 7. In this particular reflow profile, one (1) "industry standard reflow" process cycle is as follows: 1) the reflow heat treatment oven is preheated, in an inert gaseous environment such as $N_2$, to 150° C.±10° C. oven for about 67 seconds; 2) the temperature of the oven is then ramped up to a peak temperature of about 250° C. in 60 seconds (about 30° C. over the melting point of 96.5% SnAg solder); and 3) the oven is cooled back down to about 150° C.±10° C. in about 60 seconds, reaching a goal of a preselected liquid time is in the range of about 40 seconds to about 90 seconds above the melting point of the solder. Accordingly, depending upon the composition of the solder applied, the "industry standard reflow" process (i.e., the reflow profile) will vary slightly.

Applying multiples of this solder reflow profile, in accordance with the present invention requires at least three (3) "industry standard reflow" process cycles to at most about ten (10) "industry standard reflow" process cycles, in total, to fully intertwine the finger-like structure of the opposed growing intermetallic layers 41, 42. It will be appreciated, however, that at least one reflow cycle is performed during the mount and connection of the completed micro SMDxt package to a circuit board. Hence, when the initial reflow process is performed to reflow mount the solder balls onto the micro SMDxt package contact pads, at least two (2) "industry standard reflow" process cycles are applied in accordance with the present invention, the last circuit board reflow of which completes the at least three reflows process cycles. In a similar manner, thus, at most nine (9) initial reflow process cycles are to be performed to reflow mount the solder balls onto the micro SMDxt package contact pads, wherein the last reflow cycle (i.e., the tenth (10)) is performed to the mount and connect of the SMDxt package to a circuit board.

Figure 8:
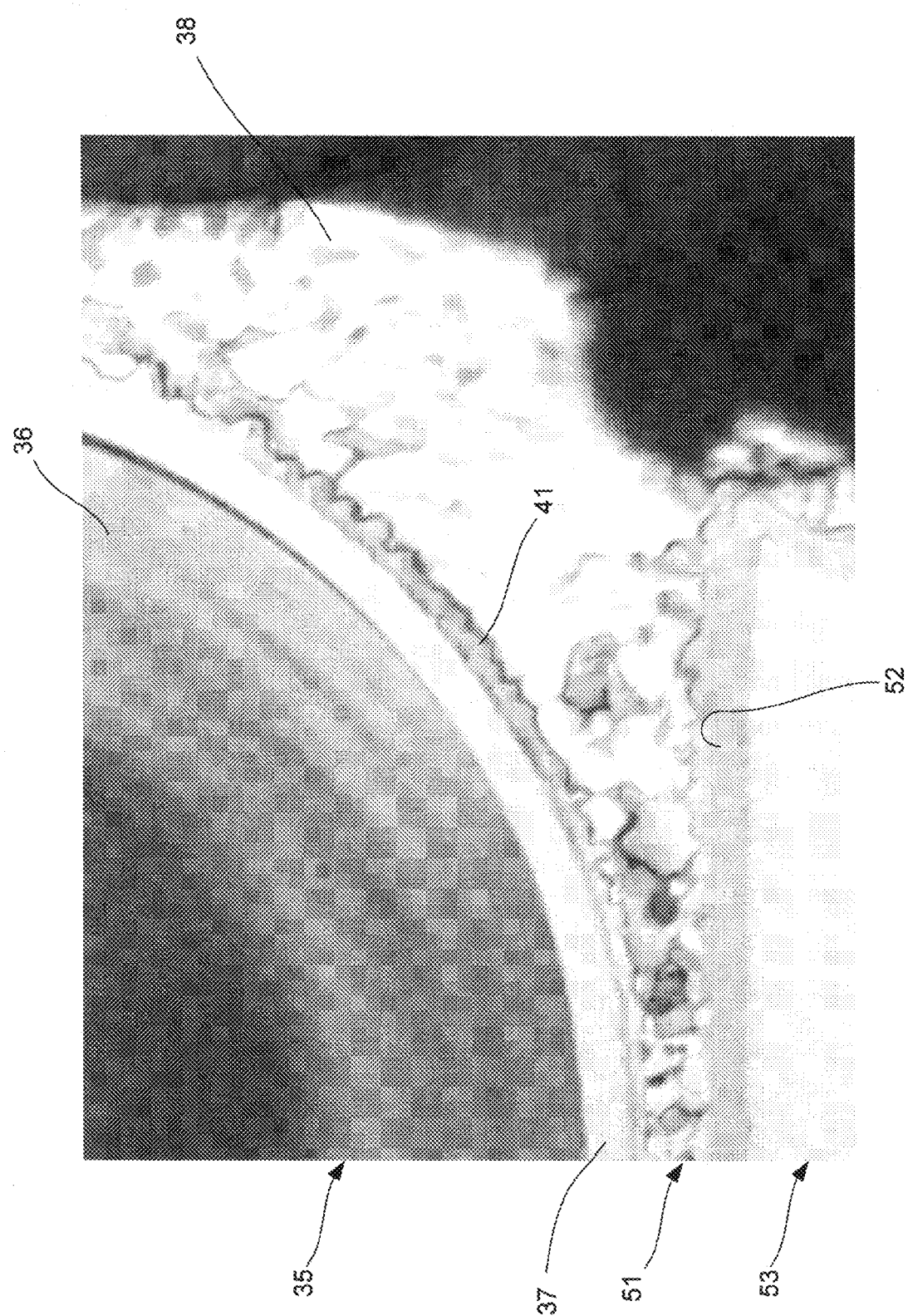
FIG. 8 is an enlarged side elevation view, in cross section, of the polymeric solder ball joint of FIG. 3, illustrating the intermetallic layer formation in the solder joint between the solder ball metallic shell and the PCB contact pad.

Referring now to FIG. 8, a solder ball (35)/PCB (53) side solder joint 51 is illustrated, having a 10× reflow cycle for the metallic shell intermetallic layer 41 (i.e., 9× reflow cycle for the contact pad/metallic shell plus 1× reflow cycle to mount the SMDxt package 25 to the PCB contacts 52). The thickness of the resulting $Cu_6Sn_5$ intermetallic growth is on the order of about 3.0-4.0 μm. In contrast, a 1× solder reflow cycle yields a thickness of the intermetallic layer (i.e., on the copper surface of the PCB contact 52) on the order of about layer 1.0-1.2 μm. With respect to a conventional solder joint on the opposed side of the solder ball (i.e., the solder ball/contact pad side), however, a total of a 2× solder reflow in conventional practice (i.e., 1× for wafer bumping plus 1× for mounting to a circuit board).

As mentioned, the application of a total of 3×-10× solder reflow cycles has shown to be unexpectedly beneficial drop/flex testing and thermal cycle testing for the reasons set forth above. Referring now to the table of FIG. 9, the thermal cycling test results are illustrated for a common micro SMDxt package having thirty-two (32) contacts. Column 4 represents the number of unit level solder reflows (i.e., the number of reflows on the wafer level, mounting the solder balls to the contact pads). Column 5, by comparison, represents the number of PCB level reflows (i.e., the number of reflows when mounting the package 25 to the PCB 53). Column 6 represents the total number of solder reflows (i.e., the sum of column 4 and column 5), while columns 7 through 13 represent the number of contact/solder ball joint failures in the number of thermal cycles cited.

Accordingly, Leg ID's 1-5 represent only a solder reflows on a PCB level, with Leg ID 1 representative of the current industry standard, while Leg ID's 6-10 represent only those packages subjected to multiple reflows on a unit level in combination with one (1) PCB reflow. Leg ID 6, in this latter group, generally represents the current industry standard.

Generally, the results of the PCB reflow, only, are the less favorable of the two. This is believed due to the fact that even with the number of additional reflows (up to 9) after Surface Mount Technology assembling parts, it had not formed the intermetallic structure with fingers shape from Cu shell and UBM. On the other hand, after 5-10 solder reflow process cycles, a significant reduction in the number of joint failures after 1350 cycles, as compared to the current industry standard of Leg ID 1. The improvement is even more dramatic with respect to Leg ID 10, representing ten (10) reflows.

Regarding the combined unit level/PCB level reflows, Leg ID 7 yielded the best results. In solder reflow configuration, there were no contact failures detected through nearly 2900 thermal cycles. This test device includes a total of four (4) solder reflow process cycles, three (3) at the unit level and one (1) at the PCB mount level. Regardless, even Leg ID's 8-10, having six (6) to ten (10) total reflows, yield favorable results with relatively minor degradation.

It will be appreciated, however, that more than ten (10) total "industry standard reflow" process cycles exhibits diminished returns. Observation of the overall solder joints indicates grain coarsening which is detrimental in that bonding structure become weaker. This result is believed to be caused by the thermal annealing by number of standard reflows.

Figure 10:
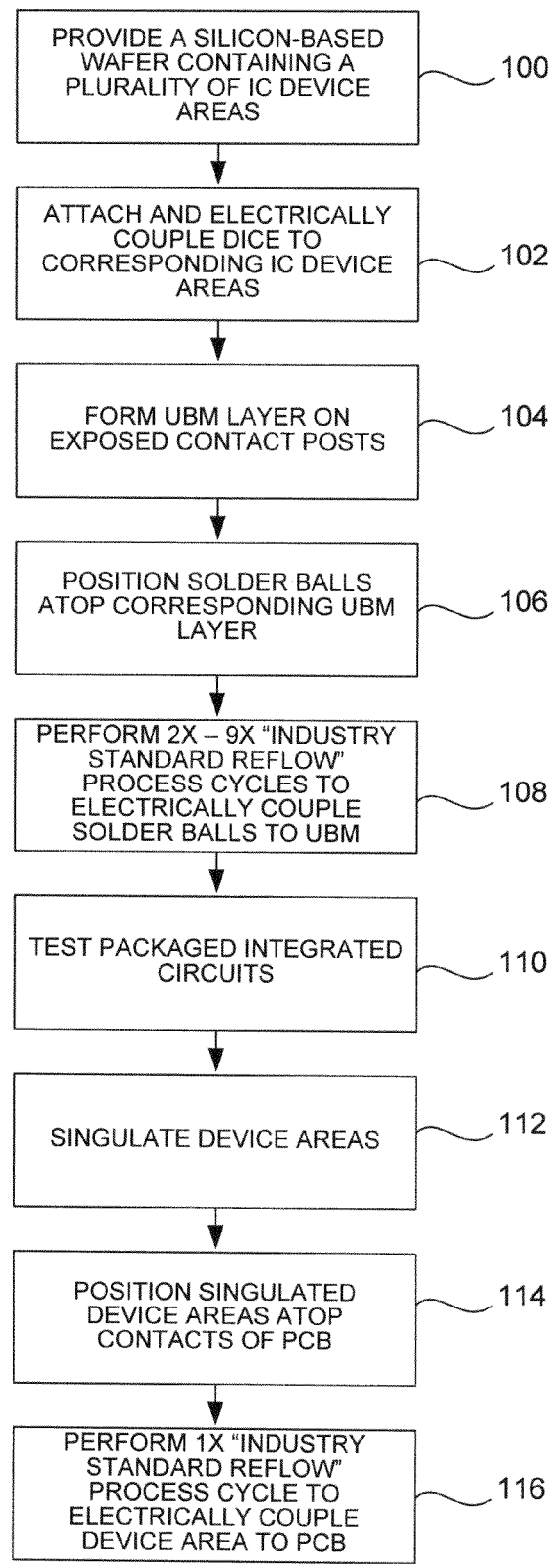
FIG. 10 is a flow chart illustrating a method of packaging an integrated circuit and the formation of the high-strength solder joint in accordance with one embodiment of the present invention.

Referring next to FIG. 10, a method for forming a high-strength solder joint between a plurality of solder ball 35 and a plurality of corresponding contact pads of a microelectronic circuit package is illustrated. The method initially includes providing a wafer based device having a plurality of device areas (e.g., a silicon-based IC 32), each area of which contains an active side having the plurality of contact pads 33 of the contact posts (Step 100). The resulting microelectronic circuit package, of course, is preferably a micro SMDxt package 25 that includes the silicon-based IC 32 with a die (not shown) on one side and the opposite active side containing the array of contact pads 33.

As would be typical, the dice may be attached to each IC device area using conventional die attach techniques, and electrically connected to their associated and contact pads 33 using conventional techniques (Step 102).

After full exposure of the contact pads 46 and the bottom surface or active side of IC device areas, a multi-layer Under Bump Metallurgy (UBM) layer 45 can be optionally plated or sputtered one the bottom of each contact post using conventional techniques (Step 104). Such a UBM layer 45, as shown in FIG. 6, is particularly suitable for use with these copper-shelled solder balls 35 since the newly formed UBM layer 45 of the contact pad 33 is sized and dimensioned to seat and align them with the corresponding contact post solder bumping (solder ball assembly on wafer).

The wafer device is then positioned such that the array of contact pads 33 of each IC device area is face up. A plurality of solder balls 35 are positioned and seated atop the corresponding contact pads 33, and/or the pad of the UBM layer 45 (Step 106). Hence, the solder balls 35 are aligned and positioned in a manner corresponding to the array outline of the device areas and solder alignment due to surface tension force of solder (SnAg).

As mentioned, each solder ball 35 consists of a polymeric core 36 with a copper shell 37 followed by an outer solder layer 38, (e.g., a 96.5% tin-silver based solder) (FIG. 6). Typical of such solder balls are those commercially available by Sekisui Corporation of Japan.

Once the solder balls are correctly aligned and positioned, the wafer device with each solder balls/IC device area is placed in a heat treatment oven for solder reflow. In accordance with the present invention, at least two (2), but no more than nine (9), independent "industry standard reflow" process cycles are performed to reflow the solder material between each solder ball and the corresponding contact pad for electrical connection and attachment therebetween (Step 108). During the multiple reflow cycles, the growth of the respective intermetallic finger-like structures 43 is performed generally in series (i.e., during each reflow cycle). As described above, each opposing intermetallic layer 41, 42, from the outer surface of the contact pads 33 and from the outer surface of the opposed metallic shell 37 of the respective solder ball 35, are grown toward one another until they coalesce and intertwine with one another to form a respective substantially unitary intermetallic joint 30 therebetween. In the preferred embodiment, the composition of the intermetallic joint is $Cu_6Sn_5$, when the contacts and solder ball shells are primarily composed copper (Cu), and the solder material is primarily composed of tin (Sn).

As mentioned above, applying a "industry standard reflow" process cycles as a heat treatment unit of measure, it has been observed that the most favorable results have been accomplished when the "industry standard reflow" process cycle is performed a total of 4 times, as shown in the table of FIG. 9.

After formation of the intermetallic joint, the IC device areas may be optionally tested (Step 110), and then cut in order to singulate the individual packaged devices (Step 112). A variety of different cutting techniques can be used, as for example, sawing, laser cutting, etc. After the packages have been separated, any desired device level processing and/or additional testing may be performed and the packaging process is complete.

The opposed side of the solder balls 35 of the individual packages 25 can then be positioned and align with the contact of a circuit board (Step 114), and then placed in a heat treatment oven for final mounting, and electrical connection to the contact pads of the circuit board. Applying a final "industry standard reflow" process cycles, the individual packages 25 can be mounted to the circuit board (Step 116). This remaining solder reflow cycle should of course be considered when determining the total number of multiple reflow cycles desired.

Although only a few embodiments of the invention have been described in detail, it should be appreciated that the invention may be implemented in many other forms without departing from the spirit or scope of the invention. Although specific features have been described (such as the contact post array layout), it should be appreciated the present invention applies to virtually any desired footprint. Moreover, the geometry of the contact posts and other structures may be varied as appropriate for a particular application. For example, in the illustrated embodiments, the contact posts have a substantially round footprint. However, in other embodiments, alternative cross section geometries, such as square, rectangular or oval footprints may be formed. Furthermore, other combinations acceptable contact, metallic shell and solder material compositions may be applied that yield other favorable intermetallic layer alloys that are stronger and more crack resistant than the underlying solder material.

The invention claimed is:

1. A method for forming a high-strength solder joint between a solder ball and a microelectronic circuit package that contains at least one contact pad at its interconnect face, said method comprising:
   providing at least one solder ball, said solder ball having a polymeric core surrounded by a metallic shell, containing copper (Cu), that in turn is surrounded by a layer of solder material, containing tin (Sn);
   positioning the at least one solder ball atop the at least one contact pad of the circuit package, said contact pad containing copper (Cu); and
   reflowing said solder material between the solder ball and the corresponding contact pad for a preselected temperature range and a preselected time range such that an intermetallic layer, composed of $Cu_6Sn_5$ and formed on an outer surface of the contact pad, and an opposed intermetallic layer, composed of $Cu_6Sn_5$ and formed on an outer surface of the metallic shell of the solder ball, coalesce and intertwine with one another to form a substantially unitary intermetallic joint therebetween.

2. The method as recited in claim 1, wherein
   said reflowing said solder material is accomplished by independently performing at least two (2) "industry standard reflow" process cycles on the solder ball/microelectronic circuit package.

3. The method as recited in claim 1, wherein
   said reflowing said solder material is accomplished by independently performing at least two (2), but no more than nine (9), "industry standard reflow" process cycles on the solder ball/microelectronic circuit package.

4. The method as recited in claim 2, wherein
   said reflowing said solder material is accomplished by independently performing a total of four (4) "industry standard reflow" process cycles on the solder ball/microelectronic circuit package.

5. The method as recited in claim 4, further including:
   mounting the microelectronic circuit package to a circuit board by independently performing another "industry standard reflow" process cycle on the solder ball/microelectronic circuit package.

6. The method as recited in claim 3, further including:
   mounting the microelectronic circuit package to a circuit board by independently performing another "industry standard reflow" process cycle on the solder ball/microelectronic circuit package.

7. The method as recited in claim 1, further including:
   providing said microelectronic circuit package in the form of a Micro SMDxt package, said interconnect face containing at least a 10×11 array outline of contact pads, and each said contact pad containing at least an outer layer comprised of copper;
   said positioning includes positioning a solder ball atop each corresponding contact pad of the circuit package;
   simultaneously reflowing the solder material about and between a respective solder ball and the corresponding contact pad for a preselected temperature range and a preselected time range such that a respective intermetallic layer formed on the contact pad and an respective, opposed, intermetallic layer formed on the solder ball coalesce and intertwine with one another to form a respective substantially unitary intermetallic joint therebetween.

8. The method as recited in claim 1, wherein
said preselected temperature for said reflow is in the range of about 240° C. to about 255° C., and said preselected time is in the range of about 40 seconds to about 90 seconds.

9. The method as recited in claim 1; further including:
prior to positioning the at least one solder ball, forming a UBM layer component of the contact pad to provide a seat for the solder ball.

10. A method for mounting a microelectronic circuit package that contains a plurality of metallic contact pads at it interconnect face to a circuit board that contains metallic contacts corresponding in their layout to that metallic contact pads of the circuit package, said method comprising:

providing a plurality of solder balls, each said solder ball having a polymeric core surrounded by a metallic shell that in turn is surrounded by a layer of solder material;

positioning each of solder balls atop a corresponding contact pad of the circuit package; and independently applying at least two (2), but no more than nine (9), "industry standard reflow" process cycles on the solder balls/microelectronic circuit package to reflow said solder material between each solder ball and the corresponding contact pad such that a respective intermetallic layer, formed on an outer surface of the contact pad, and a respective opposed intermetallic layer, formed on an outer surface of the metallic shell of the solder ball, coalesce and intertwine with one another to form a respective substantially unitary intermetallic joint therebetween;

positioning the circuit package, together with the reflowed solder balls, in alignment and mounting contact with the corresponding metallic contacts of the circuit board; and electrically connecting the contact pads of the circuit package to the corresponding contact pads of the circuit board.

11. The method as recited in claim 10, wherein
said electrically connecting includes applying one of the "industry standard reflow" process cycles to the circuit package/solder ball/circuit board combination.

12. The method as recited in claim 11, wherein
said independently performing an "industry standard reflow" process is performed a total of 4 reflow cycles.

13. The method as recited in claim 10, wherein
the independently applying the "industry standard reflow" process cycles includes growing fingers of the respective intermetallic layer on the contact pad, and that of the respective intermetallic layer of the solder ball toward one another until intertwined.

14. The method as recited in claim 10, wherein
the metallic shell of the solder balls contains copper (Cu), the outer surface of the respective contact pads contain copper, and said solder material contains tin (Sn), such that said intermetallic joint is comprised primarily of a $Cu_6Sn_5$ alloy.

15. The method as recited in claim 10; further including:
prior to the positioning of each of the solder balls, forming a UBM layer component of the contact pad to provide a seat for each respective solder ball.

16. The method as recited in claim 10, further including:
prior to the providing a plurality of solder balls, providing said microelectronic circuit package in the form of a Micro SMDxt package, said interconnect face containing at least an 10×11 array outline of contact pads, and each said contact pad containing at least an outer layer comprised of copper.

* * * * *